(12) United States Patent
Clissold et al.

(10) Patent No.: US 8,704,687 B2
(45) Date of Patent: Apr. 22, 2014

(54) CODE SET CONVERSION MANAGEMENT OPTIMIZATION

(75) Inventors: David N. Clissold, Austin, TX (US); Mark A. Grubbs, Round Rock, TX (US); Su Liu, Round Rock, TX (US); Kevin R. Sloan, Pflugerville, TX (US)

(73) Assignee: International Business Machines Corporation, Armonk, NY (US)

( * ) Notice: Subject to any disclaimer, the term of this patent is extended or adjusted under 35 U.S.C. 154(b) by 24 days.

(21) Appl. No.: 13/564,553

(22) Filed: Aug. 1, 2012

(65) Prior Publication Data

US 2014/0035764 A1    Feb. 6, 2014

(51) Int. Cl.
*H03M 7/00*    (2006.01)

(52) U.S. Cl.
USPC .............. 341/55; 707/746; 707/760; 341/106

(58) Field of Classification Search
USPC .............................................. 341/51, 55, 106
See application file for complete search history.

(56) References Cited

U.S. PATENT DOCUMENTS

| | | | | |
|---|---|---|---|---|
| 4,876,541 | A | * | 10/1989 | Storer .............................. 341/51 |
| 5,592,594 | A | * | 1/1997 | Cahoon ......................... 358/1.16 |
| 5,929,792 | A | * | 7/1999 | Herriot ............................ 341/55 |
| 7,849,085 | B2 | | 12/2010 | Taniai et al. |

OTHER PUBLICATIONS

Rannenberg et al, "The X/Open Internationalization Model", Digital Technical Journal, vol. 5—No. 3, 1993 ftp://78.24.191.182/pub/linux/mips/people/macro/DEC/DTJ/DTJB03/DTJB03PF.PDF.
Jay et al, "IBM Informix Developer's Handbook", Aug. 23, 2010 http://www.ibm.com/developerworks/wikis/download/attachments/116982205/IBM_Informix_Developers_Handbook.pdf?version=1).

* cited by examiner

*Primary Examiner* — Howard Williams
(74) *Attorney, Agent, or Firm* — Yudell Isidore Ng Russell PLLC

(57) ABSTRACT

A management module registers a request to convert code from a first code set to a second code set, identifies a code set converter (CSC), determines whether a most recently used CSC is the identified CSC and, in response to determining that the most recently used CSC is not the identified CSC, locates a user-preferred CSC pool comprising a subset of locally stored CSCs each corresponding to a preference index. The management module, in response to determining that the identified CSC is located within the user-preferred CSC pool, searches the user-preferred CSC pool for the identified CSC, loads the identified CSC, initiates the identified CSC that converts the code from the first code set to the second code set, modifies usage data for the identified CSC, and orders the user-preferred CSC pool based on a preference index for each CSC stored in the CSC pool.

21 Claims, 5 Drawing Sheets

| CSC NAME | FROM WEIGHT | TO WEIGHT | USAGE HISTORY | PREFERENCE INDEX |
|---|---|---|---|---|
| GB18030_UTF-8 | 0.30 | 0.90 | 600 | 360 |
| IBM-943_UTF-8 | 0.30 | 0.90 | 650 | 390 |
| ISO8859-7_UTF-8 | 0.50 | 0.90 | 630 | 441 |
| ISO8859-8_UTF-8 | 0.50 | 0.90 | 670 | 469 |
| ISO8859-6_UTF-8 | 0.50 | 0.90 | 700 | 490 |
| ISO8859-4_UTF-8 | 0.50 | 0.90 | 750 | 525 |
| UCS-2_ISO8859-1 | 1.00 | 1.00 | 900 | 900 |

CODE SET CONVERSION MANAGEMENT OPTIMIZATION

BACKGROUND

1. Technical Field

The present invention generally relates to data processing, and more particularly, to code set conversion.

2. Description of the Related Art

A code set or coded character set is a set of rules that defines a character set and the one-to-one relationship between each character and its bit pattern. Code set conversion is used to convert encoded human language characters from one encoding to another. Code set conversion is an important feature in a multi-national server operating system, especially in an information exchange network, such as crossing platform information exchanges and network computing. Thousands of code set converters have been supported based on different requirements and standards worldwide. Efficiently tuning, managing, retrieving, loading the thousands of code set converters is a challenging task for modern operating systems.

BRIEF SUMMARY

Aspects of the described embodiments provide a method, a system, and a computer program product including a management module that registers a request to convert code from a first code set to a second code set, identifies a code set converter (CSC), determines whether a most recently used CSC is the identified CSC and, in response to determining that the most recently used CSC is not the identified CSC, locates a user-preferred CSC pool comprising a subset of locally stored CSCs each corresponding to a preference index. The management module, in response to determining that the identified CSC is located within the user-preferred CSC pool, searches the user-preferred CSC pool for the identified CSC, loads the identified CSC, initiates the identified CSC that converts the code from the first code set to the second code set, modifies usage data for the identified CSC, and orders the user-preferred CSC pool based on a preference index for each CSC stored in the CSC pool.

With the system implementation, the system includes a processor, a memory, and computer readable code that performs the various processes of the method by executing code on the processor. Finally, the computer program product implementation comprises a computer readable storage medium that includes computer readable code which, when executed by a processor, is configured to perform the method processes.

The above summary contains simplifications, generalizations and omissions of detail and is not intended as a comprehensive description of the claimed subject matter but, rather, is intended to provide a brief overview of some of the functionality associated therewith. Other systems, methods, functionality, features and advantages of the claimed subject matter will be or will become apparent to one with skill in the art upon examination of the following figures and detailed written description.

BRIEF DESCRIPTION OF THE DRAWINGS

The description of the illustrative embodiments is to be read in conjunction with the accompanying drawings, wherein:

FIG. 4 is a depicts exemplary data found within the code set converter store, according to one embodiment.

DETAILED DESCRIPTION

Figure 1:
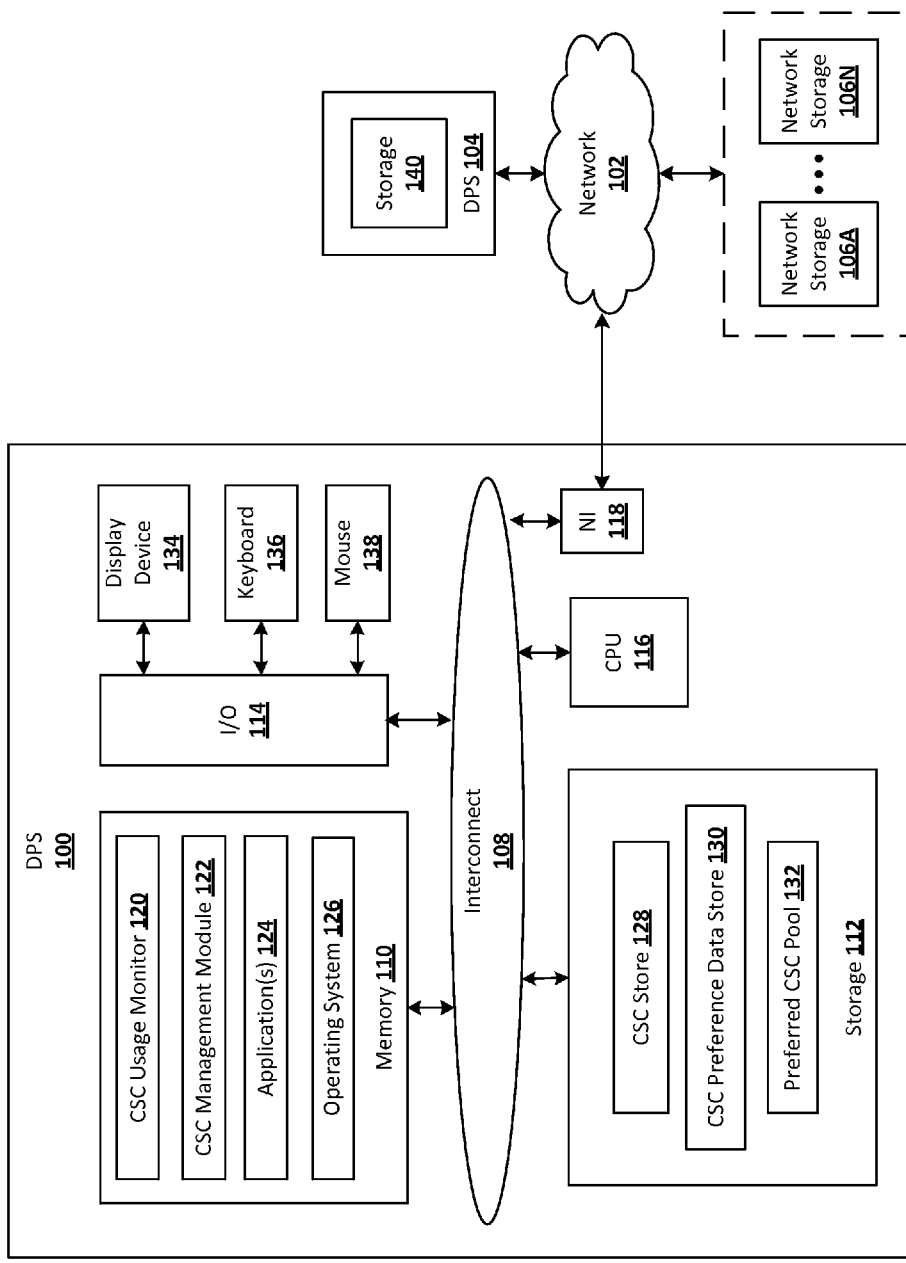
FIG. 1 provides a block diagram representation of an illustrative network of data processing systems within which the invention can be practiced, according to one embodiment.

The illustrative embodiments provide a method, system and computer program product for optimized code set conversion. Briefly, a user-preferred code set converter (CSC) pool is maintained. The user-preferred CSC pool includes a subset of all available CSCs, and the CSCs within the pool are dynamically reordered based on usage and system modifications. In one or more embodiments, the CSC pool is searched for a requested CSC prior to initiating a traditional search through all available CSCs.

In the following detailed description of exemplary embodiments of the invention, specific exemplary embodiments in which the invention may be practiced are described in sufficient detail to enable those skilled in the art to practice the invention, and it is to be understood that other embodiments may be utilized and that logical, architectural, programmatic, mechanical, electrical and other changes may be made without departing from the spirit or scope of the present invention. The following detailed description is, therefore, not to be taken in a limiting sense, and the scope of the present invention is defined by the appended claims and equivalents thereof.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Aspects of the present invention are described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions (or code). These computer program instructions may be provided to a processor of a general purpose computer, special purpose computer, or other programmable data processing apparatus to produce a machine, such that the instructions, which execute via the processor of the computer or other programmable data processing apparatus, implement the methods/processes/functions/acts specified in the one or more blocks of the flowchart(s) and/or block diagram(s).

These computer program instructions may also be stored in a computer readable medium that can direct a computer, other programmable data processing apparatus, or other devices to function in a particular manner, such that the instructions stored in the computer readable medium produce an article of manufacture (or computer program product) including instructions which implement the method process/function/act specified in the one or more blocks of the flowchart(s) and/or block diagram(s). The computer program instructions may also be loaded onto a computer, other programmable data processing apparatus, or other devices to cause a series of operational steps to be performed on the computer, other programmable apparatus or other devices to produce a computer implemented process/method, such that the instructions which execute on the computer or other programmable apparatus implement the method/process/functions/acts specified in one or more blocks of the flowchart(s) and/or block diagram(s).

It is understood that the use of specific component, device and/or parameter names (such as those of the executing utility/logic described herein) are for example only and not meant to imply any limitations on the invention. The invention may thus be implemented with different nomenclature/terminology utilized to describe the components, devices, or parameters herein, without limitation. Each term utilized herein is to be given its broadest interpretation given the context in which that terms is utilized.

With reference now to the figures, and beginning with FIG. 1, there is depicted a block diagram representation of an illustrative data processing system (DPS) 100, which is connected to a second DPS 104, as well as various network storage devices 106A-106N, across a network 102. In one or more embodiments, DPS 104 may include a storage device 140. In one or more embodiments, any one of network storage 106A-106N may additionally, or alternatively, include one or more storage devices.

DPS 100 includes numerous components logically connected by an interconnect 108. Specifically, FIG. 1 depicts DPS 100 including a memory 110, a storage 112, an input/output (I/O) controller 114, central processing unit (CPU) 116 (also interchangeably referred to as a processor), and network interface (NI) 118. Those skilled in the art will appreciate that CPU 116 can be any kind of hardware processor. I/O controller 114 allows a user to interface with DPS 100 via one or more I/O devices, such as display device 134, keyboard 136, and mouse 138.

Storage 112 may be any kind of computer storage device, volatile or non-volatile, such as a hard disk, an optical drive such as a compact disk drive or digital video disk (DVD) drive, and a flash memory drive. In one or more embodiments, storage 112 may include one or more of CSC store 128, CSC preference data store 130, and preferred CSC pool 132. However, in one or more embodiments, any or all of CSC store 128, CSC preference data store 130, and preferred CSC pool 132 may be stored in storage 140 within DPS 104, or within, or distributed across, any of network storage 106A-106N.

In one or more embodiments. CSC store 128 includes all available code set converters. Code set converters are modules which, when deployed, map characters encoded in a first character code set to a second character code set. Code set conversion is often necessary, for example, in information exchange or data transfer across a network, in security authentication, or in database access. Many CSCs exist, and up to thousands of converters may be available in CSC store 128, or across network 102. A subset of the available CSCs is stored in preferred CSC pool 132.

The selection and ordering of CSCs in preferred CSC pool 132 is influenced by data stored in CSC preference data store 130. Data stored in CSC preference data store 130 may include, for example, use-defined policies that determine the importance of a CSC, usage information for each CSC, system-, business model-, or geographic-based policies that determine the importance of a CSC. For example, in North America, an email server may use the CSC ISO8859-1_UTF-8 frequently, but rarely use GB18030_UTF-8. In China, GB2312_UTF-8 and GB18030_UTF-8 are frequently used to convert simplified Chinese script. In one or more embodiments, depending on geographic location, certain CSCs are more likely to be used than others.

In addition, certain system properties, such as native language, or type of system, may also influence which CSCs are more likely to be used. For example, a preferred CSC for database access may be different than a preferred CSC for use by a file system. In one or more embodiments, CSC preference data store 130 also includes a preference index for each CSC which may be calculated using some or all of the policies. In one or more embodiments, the code set from which a particular CSC converts, and the code set to which the particular CSC converts may each be associated with an index that is stored in CSC preference data 130, and is used in calculating the preference index for each CSC.

Memory 110 may be random access memory (RAM), cache memory, flash memory, or any other kind of storage structure or device that is configured to store computer instructions/code executable by CPU 116 and/or to store data utilized during such execution. As depicted, memory 110 includes operating system 126. Operating system 126 may be any platform that manages the execution of computer code and manages hardware resources. For example, operating system 126 may be the Advanced Interactive Executive (AIX®) operating system, the LINUX® operating system, or any other operating system known in the art. AIX® is a registered trademark of International Business Machines Corporation, and LINUX® is a registered trademark of Linus Torvalds.

Memory 110 also includes one or more applications 124 and a plurality of functional modules, such as CSC usage monitor 120, and CSC management module 122. For purposes of clarity of this description, applications 124, as well as data replication module 120 and penalty module 122, are executable computer code which can be executed and which can manage code set conversion. In one or more embodiments, CSC usage monitor 120 includes computer code which, when executed by CPU 116, tracks usage of various CSCs. In one or more embodiment, CSC usage monitor 120 may track usage of CSCs locally by DPS 100, or across network 102 by DPS 104. Memory 110 may load CSC store 128, CSC preference data store 130, and preferred CSC pool 132 from Storage 112 for CSC Management Module 122.

CSC management module 122 searches and loads a CSC needed to convert code from a first code set to a second code set. In one or more embodiments, CSC management module 122 determines whether the requested CSC was the last used CSC. In one or more embodiments, the last used CSC is identified by a pointer in preferred CSC pool 132. If the requested CSC is not the last used CSC, then the CSC Management Module 122 searches for the requested CSC in the preferred CSC pool 132. In one or more embodiments, the CSC management module 122 searches the preferred CSC pool 132 iteratively in order by preference index. For example, in one or more embodiments, the CSC management module 122 searches the preferred CSC pool 132 by highest preference index to lowest preference index, where the preference index indicates the likelihood that each CSC stored in the preferred CSC pool 132 will be used. If the CSC management module 122 finds the requested CSC in the pool, then the CSC is loaded and initiated, and a pointer is set to indicate that the requested CSC is the most recently used CSC.

In one or more embodiments, CSC management module 122 also manages the ordering and selection of the CSCs stored in preferred CSC pool 132. CSC management module 122 may calculate the preference index for each CSC to determine which CSCs should be included in the preferred CSC pool 132. In one or more embodiments, CSC management module 122 may recalculate and reorder preference index in response to a new request for a CSC or deployment of a CSC. In addition, CSC management module 122 may also dynamically reorder the CSCs in preferred CSC pool 132 upon registering a modification to any feature used to calculate the preference index. For example, if CSC management module 122 detects that the geographic location has changed to a location where a different language is more popular than in the original location, CSC management module 122 may recalculate the preference index for the CSCs. In one embodiment, the CSC management module 122 may recalculate the preference index only for the CSCs stored in the preferred CSC pool 132 or for all CSCs within CSC store 128.

Those of ordinary skill in the art will appreciate that the hardware components and basic configuration depicted in FIG. 1 may vary. The illustrative components within DPS 100 are not intended to be exhaustive, but rather are representative to highlight components that can be utilized to implement the present invention. For example, other devices/components may be used in addition to or in place of the hardware depicted. The depicted example is not meant to imply architectural or other limitations with respect to the presently described embodiments and/or the general invention. The data processing system depicted in FIG. 1 may be, for example, IBM Power Systems, a product of International Business Machines Corporation in Armonk. N.Y., running the Advanced Interactive Executive (AIX) operating system or LINUX operating system.

Figure 2:
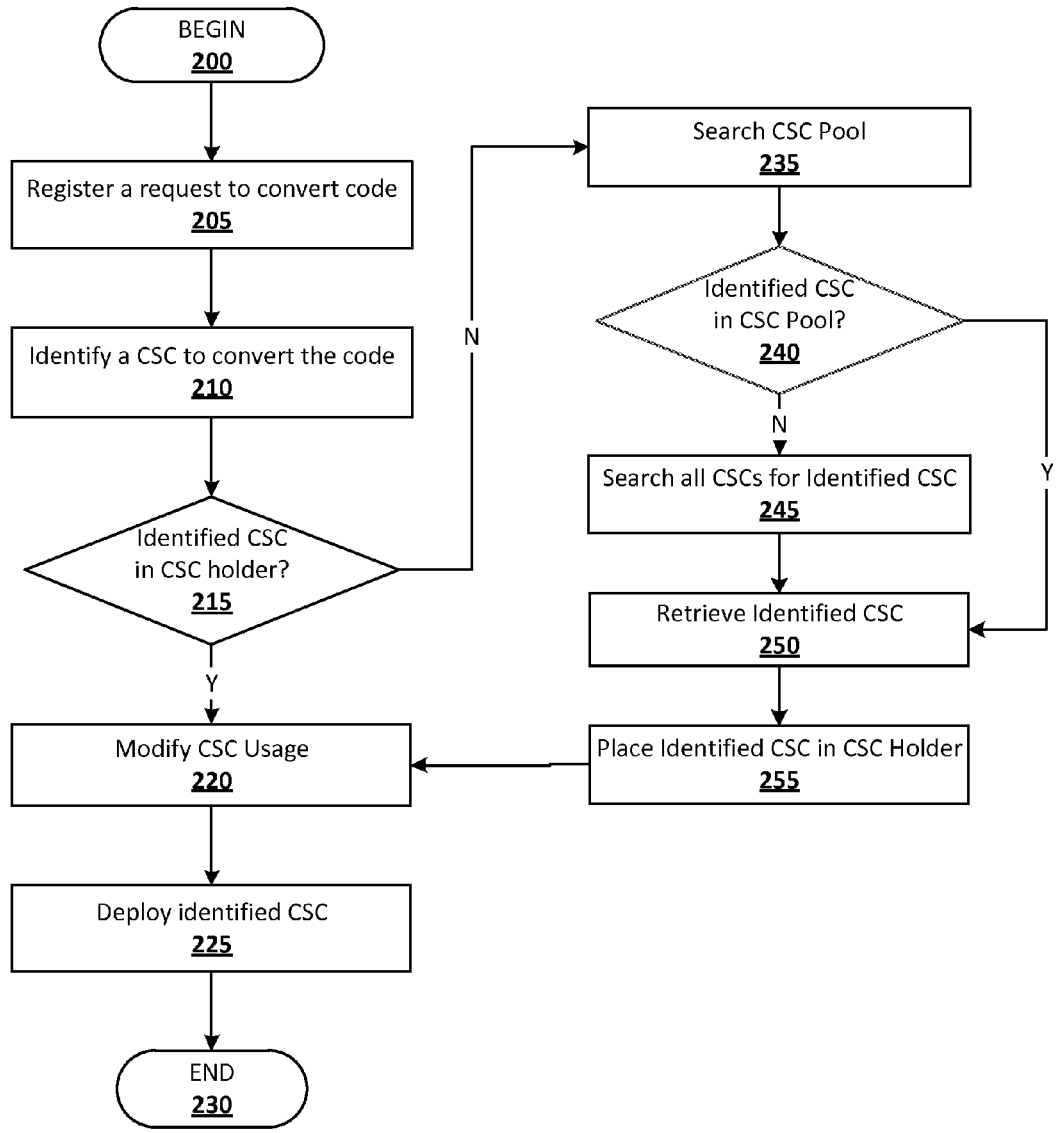
FIG. 2 provides a flow chart illustrating a method for retrieving a code set converter, according to one embodiment.

FIG. 2 is a flow chart illustrating a method for retrieving and deploying a code set converter (CSC), according to one embodiment. Specifically, FIG. 2 illustrates a method, implemented by CSC management module 122 (which provides executable code executable by a processor), to find and deploy requested CSCs. In the following flowcharts, reference will be made to modules and devices depicted in FIG. 1 for clarity.

The method begins at block 200. At block 205, CSC management module 122 registers a request to convert an encoded character string from a first code set to a second code set. In one or more embodiments, the request may originate, for example, from an application 124 or operating system 126. At block 210, CSC management module 122 identifies a CSC to convert the character string from the first code set to the second code set. At decision block 215, CSC management module 122 determines whether or not the identified CSC is the most recently used CSC, or in the CSC holder. Said another way, the CSC management module 122 determines whether the pointer in the preferred CSC pool 132 indicates the identified CSC. If the identified CSC is in the CSC holder, then the method continues at block 220. At block 220, CSC management module 122 modifies CSC usage data for the identified CSC. In one or more embodiments, CSC management module 122 increases usage data corresponding to the identified CSC, for example, in CSC preference data 130. In one or more embodiments, modification of CSC usage triggers reordering of preferred CSC pool 132, as discussed with respect to FIG. 3 below. The method continues at block 225, and CSC management module 122 deploys, or causes to be deployed, the identified CSC to perform the requested conversion of the character string. The method ends at block 230.

Returning to decision block 215, if the identified CSC is not in the CSC holder, then the method continues at block 235, and CSC management module 122 searches for the identified CSC in preferred CSC pool 132. In one or more embodiments, each CSC in preferred CSC pool 132 is associated with a preference index. In one or more embodiments, the CSCs stored in preferred CSC pool 132 are ordered by preference index (see, e.g., FIG. 4), and CSC management module 122 searches preferred CSC pool 132 for the identified CSC in order of preference index. The preference index indicates the likelihood that each CSC will be selected as compared to other CSCs, and the CSC in preferred CSC pool 132 with the highest preference index is examined first. CSC management module 122 continues to examine each CSC stored in the preferred CSC pool 132 in order of preference index until the identified CSC is found, or until it is determined that the identified CSC is not stored in the preferred CSC pool 132.

If at decision block 240 CSC management module 122 determines that the identified CSC is not located within preferred CSC pool 132, then the method continues at block 245, and the CSC management module 122 searches through available CSCs (for example, in CSC store 128) for the identified CSC. In one or more embodiments, CSC management module 122 uses traditional search algorithms, such as consulting a one-to-one mapping table, or searching for an alias for the identified CSC. When the CSC is found either after decision block 240 or block 245, then the method continues at block 250.

At block 250. CSC management module 122 retrieves the identified CSC from its location in CSC store 128, and at block 255, the CSC management module 122 places the identified CSC in the CSC holder. In one or more embodiments, CSC management module 122 places the identified CSC in the CSC holder by causing the pointer in preferred CSC pool 132 to point to the identified CSC. In one or more embodiments, if at decision block 240, CSC management module 122 determines that the identified CSC was not located in preferred CSC pool 132, then CSC management module 122 adds the identified CSC to preferred CSC pool 132 (see, e.g., FIG. 5) prior to placing the identified CSC in the CSC holder.

The method continues at block 220, and CSC management module 122 modifies CSC usage data for the identified CSC in CSC preference data store 130. For example, CSC management module 122 may increase a preferred index value of the usage history stored in CSC preference data store 130 that is associated with the importance of the identified CSC. Further, in one or more embodiments, CSC management module 122 may also modify index values related to the first and second code sets. The method continues at block 225, and the CSC management module 122 deploys, or causes to be deployed, the identified CSC. The method ends at block 230.

Figure 3:
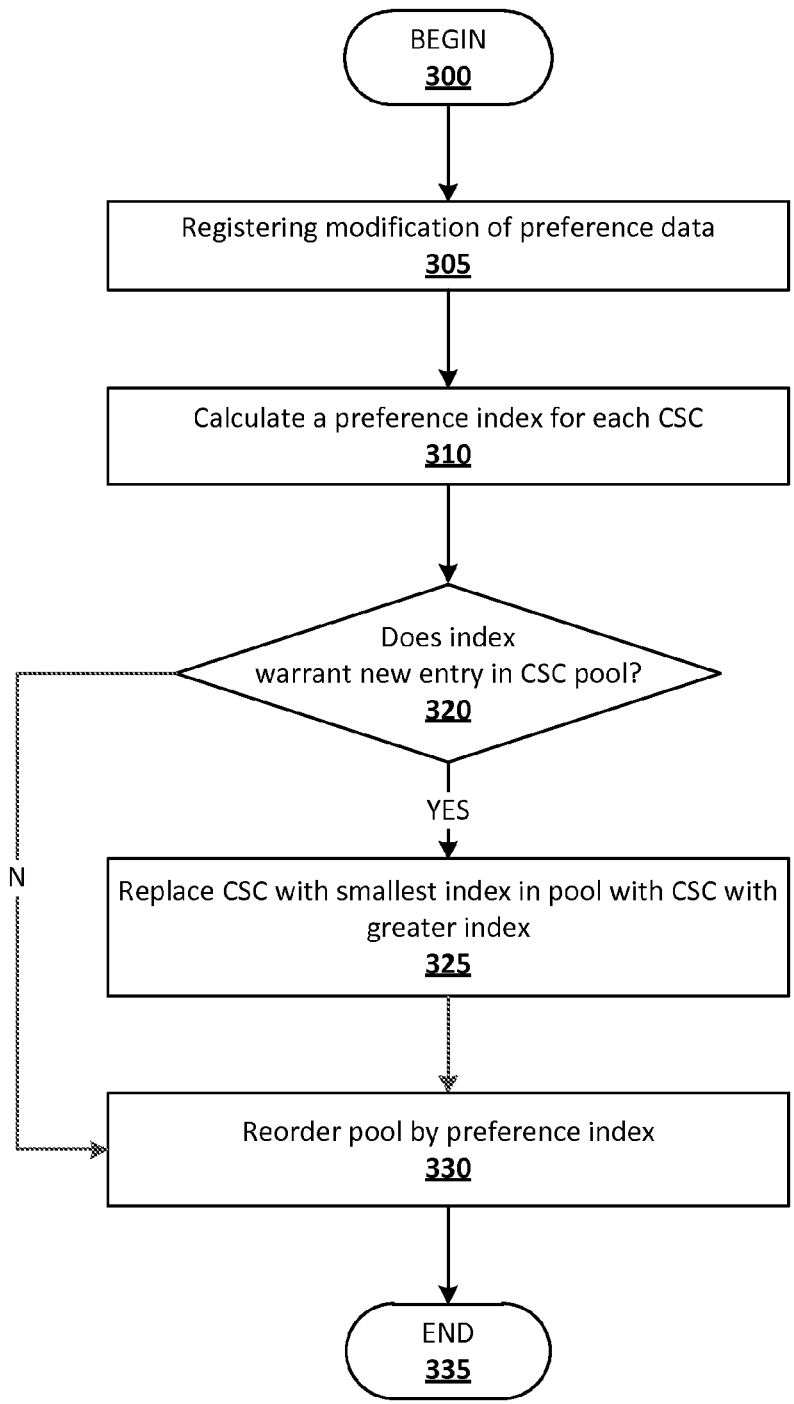
FIG. 3 is a flow chart illustrating a method for managing and ordering a preferred code set converter pool, according to one embodiment.

FIG. 3 is a flow chart illustrating a method for managing and ordering a preferred code set converter pool, according to one embodiment. Specifically, FIG. 3 illustrates a method, implemented by CSC management module 122 (which provides executable code executable by a processor), to select and reorder CSCs in preferred CSC pool 132.

The method begins at block 300. At block 305, CSC management module 122 registers modification of preference data. In one embodiment, CSC management module 122 may register modification of usage data for the CSC in response to deploying a CSC, for example, at 225 of FIG. 2. In another embodiment, CSC management module 122 may register modification of usage data in response to DPS 104 deploying the CSC. In addition, CSC management module 122 may register modification of preference data in response to modifications in the system, or input by a user. For example, a user may add or alter policies that determine the importance of the CSCs relative to each other, or a user may indicate a preferred CSC. Another example is that preference data may be modified if a native language in the system (such as DPS 100) is modified, if the business model is changed, or if the geographic location of the system (or a source of its workload) is changed.

At block 310, CSC management module 122 calculates a preference index, or recalculates a preference index, for each CSC. In one or more embodiments, the preference index may be calculated using any number of algorithms that considers policies and data stored within CSC preference data store 130. In one or more embodiments, the preference index may be calculated for any number of CSCs within preferred CSC pool 132 or CSC store 128.

At decision block 320, CSC management module 122 determines whether the newly calculated indexes warrant a new entry in preferred CSC pool 132. For example, a CSC not currently stored in preferred CSC pool 132 may have a greater preference index than one or more of the CSCs stored in preferred CSC pool 132. In one or more embodiments, entry in preferred CSC pool 132 may also be warranted if at block 240 of FIG. 2. CSC management module 122 determines that a requested CSC is not in preferred CSC pool 240.

If, at block 320, CSC management module 122 determines that the calculated, or recalculated indexes warrant the addition of a new entry into the CSC pool, then the method continues at block 325. At block 325, CSC management module 122 replaces the CSC currently stored in preferred CSC pool 132 and having the lowest preference index with the CSC found to warrant new entry in preferred CSC pool 132 (block 320) (see, e.g., FIG. 5). The method continues at block 330, and CSC management module 122 reorders the CSCs stored in preferred CSC pool 132 based on the calculated preference index. The method ends at block 335.

In each of the flow charts above, one or more of the methods may be embodied in a computer readable medium containing computer readable code such that a series of steps are performed when the computer readable code is executed on a computing device. In some implementations, certain steps of the methods are combined, performed simultaneously or in a different order, or perhaps omitted, without deviating from the spirit and scope of the invention. Thus, while the method steps are described and illustrated in a particular sequence, use of a specific sequence of steps is not meant to imply any limitations on the invention. Changes may be made with regards to the sequence of steps without departing from the spirit or scope of the present invention. Use of a particular sequence is therefore, not to be taken in a limiting sense, and the scope of the present invention is defined only by the appended claims.

FIG. 4 depicts exemplary data stored in the CSC preference data store 130, according to one embodiment. Those skilled in the art will appreciate that the illustration depicted in FIG. 4 is intended only to provide an illustrative embodiment of the disclosure, and is not intended to limit the disclosure in any way.

As depicted, exemplary data 400 includes data corresponding to seven unique CSCs. The name of each CSC is in the format X_Y, where X is the original code set and Y is the target code set. The seven exemplary CSCs include GB18030_UTF-8, IBM-943_UTF-8, ISO8859-7_UTF-8, ISO8859-8_UTF-8, ISO8859-6_UTF-8, ISO8854-7_UTF-8, and UCS-2_ISO88589-1. Exemplary data 400 indicates that the preference index for GB18030_UTF-8 is 360. The "from weight" indicates that the weighted value given to the original code set (i.e., GB18030) is 0.3, whereas the "to weight" indicates that the weighted value given to the target code set (i.e., UTF-8) is 0.9. In addition, the usage history of GB18030_UTF-8 is 600. The value of the usage history may indicate a total number of instances in which the CSC has been deployed over time, or within a most recent time period. In addition, the value of the usage history may indicate local usage history or usage history across a network. The preference index for each CSC may be calculated any number of ways. For purposes of this example, the preference index for each CSC has been calculated by finding the sum of the "from weight" and "to weight", multiplying by the usage history, and dividing by two.

Figure 5:
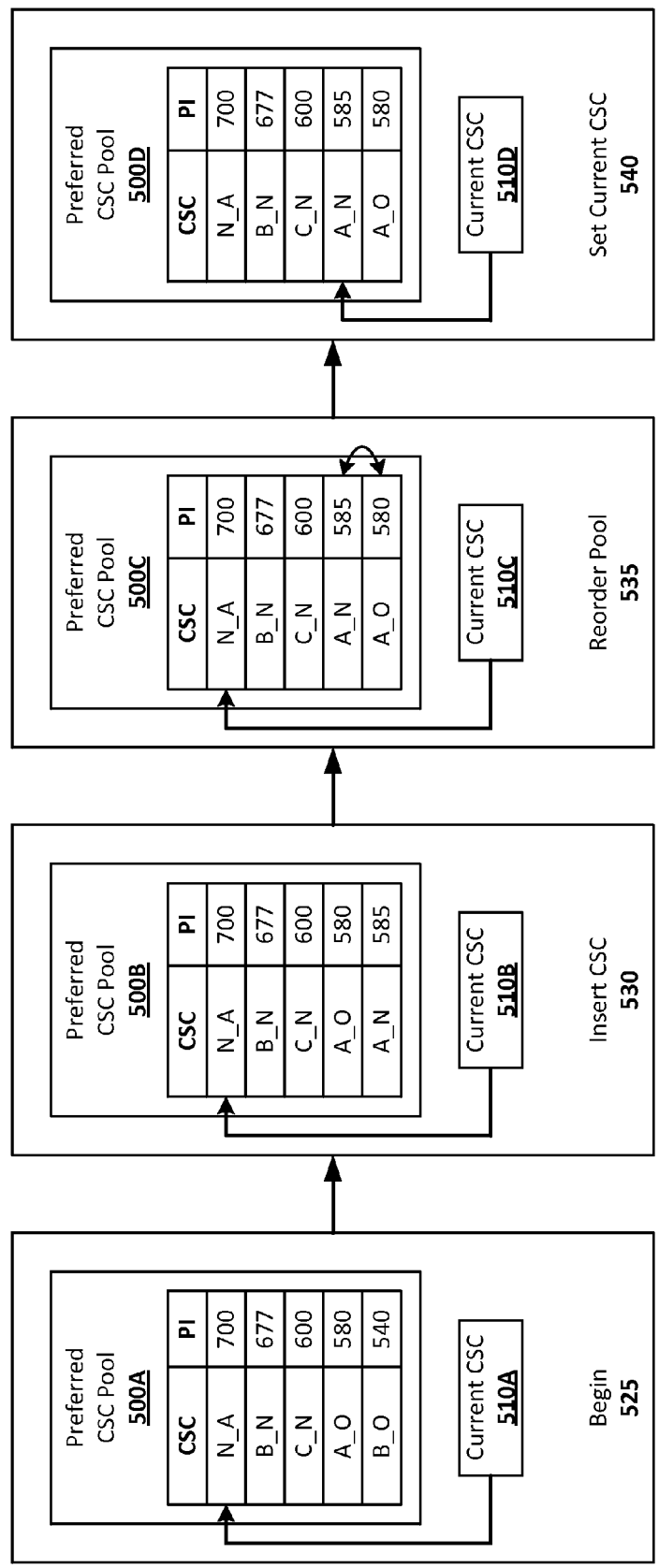
FIG. 5 depicts a timeline of inserting a code set converter into the code set converter pool and reordering the pool, according to one embodiment.

FIG. 5 depicts an exemplary timeline, according to one embodiment. Those skilled in the art will appreciate that the illustration depicted in FIG. 5 is intended only to provide an illustrative embodiment of the disclosure, and is not intended to limit the disclosure in any way.

FIG. 5 depicts the state of preferred CSC pool 132 during the methods depicted in FIG. 2 and FIG. 3. The timeline begins at 525, at which time preferred CSC pool 500A includes five CSCs: N_A having preference index 700, B_N having preference index 677, C_N having preference index 600. A_O having preference index 580, and B_O having preference index 540. The pointer indicating the current CSC 510A is currently pointing to N_A. As described above, current CSC 510A indicates that CSC N_A is the most recently used CSC.

The second state of preferred CSC pool 500B depicts preferred CSC pool 500B after CSC management module 122 inserts a new CSC. For example, in FIG. 2, if the identified CSC was not located in preferred CSC pool 132 at block 240, then the CSC management module 122 inserts a new CSC. Preferred CSC pool 500B shows that new CSC A_N has replaced B_O because, as described above, B_O is associated with the lowest preference index in the pool. Current CSC 510B remains the same.

In the third state of preferred CSC pool 500C shown at block 535, CSC management module 122 has reordered the preferred CSC pool 132 to obtain preferred CSC pool 500C. Because the newly calculated preference index for A_N is 585, CSC management module 122 reorders A_N and A_O such that A_N will be examined before A_O in a future search. Current CSC 510C remains the same.

At 540, CSC management module 122 has modified current CSC 510D to indicate that A_N is the most recently used CSC. As depicted, current CSC 510D now points to CSC A_N in preferred CSC pool 500D.

As will be appreciated by one skilled in the art, aspects of the present invention may be embodied as a system, method or computer program product. Accordingly, aspects of the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, aspects of the present invention may take the form of a computer program product embodied in one or more computer readable medium(s) having computer readable program code (or instructions) embodied thereon.

Any combination of one or more computer readable medium(s) may be utilized. The computer readable medium may be a computer readable signal medium or, alternatively, a computer readable storage medium. In some embodiments, aspects of the present invention may be embodied within a data replication module (e.g., FPGA or firmware) and implemented in firmware or logic. These embodiments can also be referred to as a "data replication module" or the like. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following devices: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible storage device that can contain, or store a program for use by or in connection with an instruction execution system, apparatus, or device.

A computer readable signal medium may include a propagated data signal with computer readable program code embodied therein, for example, in baseband or as part of a carrier wave. Such a propagated signal may take any of a variety of forms, including, but not limited to, electro-magnetic, optical, or any suitable combination thereof. A computer readable signal medium may be any computer readable medium that is not a computer readable storage medium and that can communicate, propagate, or transport a program for use by or in connection with an instruction execution system, apparatus, or device.

Program code embodied on a computer readable medium may be transmitted using any appropriate medium, including but not limited to wireless, wireline, optical fiber cable, RF signals, etc., or any suitable combination of the foregoing. Computer program code for carrying out operations for aspects of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Thus, it is important that while an illustrative embodiment of the present invention is described in the context of a fully functional computer (server) system with installed (or executed) software, those skilled in the art will appreciate that the software aspects of an illustrative embodiment of the present invention are capable of being distributed as a computer program product in a variety of forms, and that an illustrative embodiment of the present invention applies equally regardless of the particular type of media used to actually carry out the distribution.

While the invention has been described with reference to exemplary embodiments, it will be understood by those skilled in the art that various changes may be made and equivalents may be substituted for elements thereof without departing from the scope of the invention. In addition, many modifications may be made to adapt a particular system, device or component thereof to the teachings of the invention without departing from the essential scope thereof. Therefore, it is intended that the invention not be limited to the particular embodiments disclosed for carrying out this invention, but that the invention will include all embodiments falling within the scope of the appended claims. Moreover, the use of the terms first, second, etc. do not denote any order or importance, but rather the terms first, second, etc. are used to distinguish one element from another.

What is claimed is:

1. A method for code set conversion, the method comprising:
    registering a request to convert an encoded character string from a first code set to a second code set;
    identifying a code set converter (CSC) which, when executed, converts the encoded character string from the first code set to the second code set;
    determining whether a most recently used CSC is the identified CSC;
    in response to determining that the most recently used CSC is not the identified CSC, searching for the identified CSC in a user-preferred CSC pool including a subset of locally stored CSCs each corresponding to a respective preference index; and
    in response to determining that the identified CSC is located within the user-preferred CSC pool:
        loading the identified CSC;
        initiating the identified CSC that converts the encoded character string from the first code set to the second code set;
        modifying usage data for the identified CSC; and
        ordering the user-preferred CSC pool based on a preference index for each CSC stored in the user-preferred CSC pool.

2. The method of claim 1, further comprising:
    in response to determining that the identified CSC is not located within the user-preferred CSC pool, searching for the identified CSC in a CSC store holding all of the locally stored CSCs.

3. The method of claim 1, the method further comprising:
    registering modification of the usage data for the identified CSC; and
    in response to registering the modification of the usage data for the identified CSC:
        calculating the preference index for the identified CSC using the usage data;
        in response to determining that the identified CSC is not stored in the user-preferred CSC pool, storing the identified CSC in the user-preferred CSC pool; and
        reordering the subset of CSCs stored in the preferred CSC pool based on a preference index for each CSC in the user-preferred CSC pool.

4. The method of claim 3, wherein modification of the usage data for the identified CSC is registered when the identified CSC is initiated by a second system in a same network as the local system.

5. The method of claim 3, wherein the preference index for a particular CSC is calculated based on at least one factor from the group consisting of usage history, business model, geographical location of the user, user input, default weights of each code set, local system properties, and native code set.

6. The method of claim 5, further comprising:
    registering modification of at least one of the at least one of the factors; and
    in response to registering the modification of the at least one of the at least one of the factors:
        calculating the preference index for each CSC in the preferred CSC pool; and
        reordering the subset of CSCs stored in the preferred CSC pool based on a preference index for each CSC in the user-preferred CSC pool.

7. The method of claim 1, wherein the user-preferred CSC pool includes the subset of CSCs in a particular order, and wherein searching for the identified CSC comprises searching the user-preferred CSC pool in the particular order.

8. A data processing system for code set conversion, the data processing system comprising:
- a processor;
- data storage coupled to the processor; and
- program code stored within the data storage that, when processed by the processor, causes the data processing system to:
- register a request to convert an encoded character string from a first code set to a second code set;
- identify a code set converter (CSC) which, when executed, converts the encoded character string from the first code set to the second code set;
- determine whether a most recently used CSC is the identified CSC;
- in response to determining that the most recently used CSC is not the identified CSC, search for the identified CSC in a user-preferred CSC pool including a subset of locally stored CSCs each corresponding to a respective preference index; and
- in response to determining that the identified CSC is located within the user-preferred CSC pool:
  - load the identified CSC;
  - initiate the identified CSC that converts the encoded character string from the first code set to the second code set;
  - modify usage data for the identified CSC; and
  - order the user-preferred CSC pool based on a preference index for each CSC stored in the user-preferred CSC pool.

9. The system of claim 8, wherein the program code further causes the data processing system to, in response to determining that the identified CSC is not located within the user-preferred CSC pool, search for the identified CSC in a CSC store holding all of the locally stored CSCs.

10. The system of claim 8, wherein the program code further causes the data processing system to:
- register modification of the usage data for the identified CSC; and
- in response to registering the modification of the usage data for the identified CSC:
  - calculate the preference index for the identified CSC using the usage data;
  - in response to determining that the identified CSC is not stored in the user-preferred CSC pool, store the identified CSC in the user-preferred CSC pool; and
  - reorder the subset of CSCs stored in the preferred CSC pool based on a preference index for each CSC in the user-preferred CSC pool.

11. The system of claim 10, wherein modification of the usage data for the identified CSC is registered when the identified CSC is initiated by a second system in a same network as the local system.

12. The system of claim 10, wherein the preference index for a particular CSC is calculated based on at least one factor from the group consisting of usage history, business model, geographical location of the user, user input, default weights of each code set, local system properties, and native code set.

13. The system of claim 12, wherein the program code further causes the data processing system to:
- register modification of at least one of the at least one of the factors; and
- in response to registering the modification of the at least one of the at least one of the factors:
  - calculate the preference index for each CSC in the preferred CSC pool; and
  - reorder the subset of CSCs stored in the preferred CSC pool based on a preference index for each CSC in the user-preferred CSC pool.

14. The system of claim 8, wherein the user-preferred CSC pool includes the subset of CSCs in a particular order, and wherein searching for the identified CSC comprises searching the user-preferred CSC pool in the particular order.

15. A computer program product for code set conversion, the computer program product comprising:
- a non-transitory computer readable storage device; and
- program code stored within the computer readable storage device that, when processed by the processor, cause the data processing system to:
- register a request to convert an encoded character string from a first code set to a second code set;
- identify a code set converter (CSC) which, when executed, converts the encoded character string from the first code set to the second code set;
- determine whether a most recently used CSC is the identified CSC;
- in response to determining that the most recently used CSC is not the identified CSC, search for the identified CSC in a user-preferred CSC pool including a subset of locally stored CSCs each corresponding to a respective preference index; and
- in response to determining that the identified CSC is located within the user-preferred CSC pool:
  - load the identified CSC;
  - initiate the identified CSC that converts the encoded character string from the first code set to the second code set;
  - modify usage data for the identified CSC; and
  - order the user-preferred CSC pool based on a preference index for each CSC stored in the user-preferred CSC pool.

16. The computer program product of claim 15, wherein the program code further causes the data processing system to, in response to determining that the identified CSC is not located within the user-preferred CSC pool, search for the identified CSC in a CSC store holding all of the locally stored CSCs.

17. The computer program product of claim 15, wherein the program code further causes the data processing system to:
- register modification of the usage data for the identified CSC; and
- in response to registering the modification of the usage data for the identified CSC:
  - calculate the preference index for the identified CSC using the usage data;
  - in response to determining that the identified CSC is not stored in the user-preferred CSC pool, store the identified CSC in the user-preferred CSC pool; and
  - reorder the subset of CSCs stored in the preferred CSC pool based on a preference index for each CSC in the user-preferred CSC pool.

18. The computer program product of claim 17, wherein modification of the usage data for the identified CSC is registered when the identified CSC is initiated by a second system in a same network as the local system.

19. The computer program product of claim 17, wherein the preference index for a particular CSC is calculated based on at least one factor from the group consisting of usage history, business model, geographical location of the user, user input, default weights of each code set, local system properties, and native code set.

20. The computer program product of claim 19, wherein the program code further causes the data processing system to:
 register modification of at least one of the at least one of the factors; and
  in response to registering the modification of the at least one of the at least one of the factors:
   calculate the preference index for each CSC in the preferred CSC pool; and
   reorder the subset of CSCs stored in the preferred CSC pool based on a preference index for each CSC in the user-preferred CSC pool.

21. The computer program product of claim 15, wherein the user-preferred CSC pool includes the subset of CSCs in a particular order, and wherein searching for the identified CSC comprises searching the user-preferred CSC pool in the particular order.

* * * * *